(12) United States Patent
Ito et al.

(10) Patent No.: US 7,557,364 B2
(45) Date of Patent: Jul. 7, 2009

(54) CHARGE NEUTRALIZING DEVICE

(75) Inventors: Hiroyuki Ito, Chiba (JP); Noriyuki Sakudo, Ishikawa (JP); Yuichiro Sasaki, Osaka (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 196 days.

(21) Appl. No.: 11/597,324

(22) PCT Filed: May 24, 2005

(86) PCT No.: PCT/JP2005/009460

§ 371 (c)(1),
(2), (4) Date: Nov. 22, 2006

(87) PCT Pub. No.: WO2005/117059

PCT Pub. Date: Dec. 8, 2005

(65) Prior Publication Data

US 2007/0228294 A1    Oct. 4, 2007

(30) Foreign Application Priority Data

May 25, 2004    (JP) .............................. 2004-183112

(51) Int. Cl.
*G21K 5/00* (2006.01)
*H01J 7/24* (2006.01)

(52) U.S. Cl. ............................ 250/492.21; 250/492.22; 250/492.3; 315/111.21; 315/111.71; 315/111.81

(58) Field of Classification Search .............. 250/492.1, 250/492.2, 492.21, 492.3; 315/111.01, 111.21, 315/111.11, 111.71, 111.81, 111.91
See application file for complete search history.

(56) References Cited

U.S. PATENT DOCUMENTS 2,628,311 A * 2/1953 Lindenblad ................. 343/771
3,729,740 A * 4/1973 Nakahara et al. ............. 343/713

(Continued)

FOREIGN PATENT DOCUMENTS

JP           5-290790           11/1993

(Continued)

*Primary Examiner*—Bernard E Souw
(74) *Attorney, Agent, or Firm*—McDermott Will & Emery LLP

(57) ABSTRACT

Disclosed is a charge neutralizing device which is capable of being applied to a substrate 13 having a large area and in which electrons having low energy of 5 eV or less, and preferably 2 eV, are supplied so that charge due to ion implantation and damage by the electrons are avoided with respect to a cusp device. The charge neutralizing device includes a microwave generating unit, a plasma generating unit that generates electron plasma using a microwave generated from the microwave generating unit, and a contact unit that brings the electron plasma generated from the plasma generating unit into contact with a beam plasma region including an ion beam.

22 Claims, 14 Drawing Sheets

U.S. PATENT DOCUMENTS

| | | | | |
|---|---|---|---|---|
| 4,885,839 A * | 12/1989 | Ben-Dov | ............. | 29/600 |
| 5,270,724 A * | 12/1993 | Ajioka | ............. | 343/725 |
| 5,399,871 A * | 3/1995 | Ito et al. | ............. | 250/492.21 |
| 5,856,674 A * | 1/1999 | Kellerman | ............. | 250/423 F |
| 6,043,499 A * | 3/2000 | Seki et al. | ............. | 250/492.21 |
| 6,100,536 A * | 8/2000 | Ito et al. | ............. | 250/492.21 |
| 6,198,224 B1 * | 3/2001 | Spitzl et al. | ............. | 315/111.21 |
| 6,359,286 B1 * | 3/2002 | Ito et al. | ............. | 250/492.21 |
| 6,512,333 B2 * | 1/2003 | Chen | ............. | 315/111.21 |
| 6,543,380 B1 * | 4/2003 | Sung-Spitzl | ............. | 118/723 MW |
| 6,809,310 B2 * | 10/2004 | Chen | ............. | 250/251 |
| 7,067,821 B2 * | 6/2006 | Barnard et al. | ............. | 250/427 |
| 2002/0113206 A1 * | 8/2002 | Chen | ............. | 250/251 |
| 2003/0141831 A1 * | 7/2003 | Chen | ............. | 315/500 |
| 2005/0205807 A1 * | 9/2005 | Perel et al. | ............. | 250/492.21 |
| 2007/0228294 A1 * | 10/2007 | Ito et al. | ............. | 250/492.21 |

FOREIGN PATENT DOCUMENTS

| | | |
|---|---|---|
| JP | 6-88225 | 3/1994 |
| JP | 6-283121 A | 10/1994 |
| JP | 6-283131 A | 10/1994 |
| JP | 8-21361 B2 | 3/1996 |
| JP | 2002-352761 A | 12/2002 |

* cited by examiner

13: SUBSTRATE
20: FIELD INSULATING FILM
21: GATE INSULATING FILM
22: GATE ELECTRODE

2: ION SOURCE CHAMBER
3: BEAMLINE
4: END STATION
5: ION SOURCE
6: EXTRACTION ELECTRODES
7: ION BEAM
8: MASS SEPARATOR
9: TRIMMING APERTURE
10: MASS RESOLVING SLIT
13: SUBSTRATE
14: ROTATING DISK
30: ION IMPLANTER
31: ELECTRON SOURCE

11: FARADAY CAGE
31: ELECTRON SOURCE
40: ARC CHAMBER
41:
42: PERMANENT MAGNET
43: GAS BOTTLE
44: GAS INLET
45: EXTRACTION ELECTRODE
46: DECELERATION ELECTRODE

CHARGE NEUTRALIZING DEVICE

RELATED APPLICATIONS

This application is the U.S. National Phase under 35 U.S.C. § 371 of International Application No. PCT/JP2005/009460, filed on May 24, 2005, which in turn claims the benefit of Japanese Application No. 2004-183112, filed on May 25, 2004, the disclosures of which Applications are incorporated by reference herein.

TECHNICAL FIELD

The present invention relates to a charge neutralizing device and, more particularly, to a charge neutralizing device that is applied to an ion implanting device used to form an impurity layer on a semiconductor substrate during a process of producing a semiconductor, a semiconductor device produced using the same, and an electronic element, such as a liquid crystal panel, on which the semiconductor device is mounted.

BACKGROUND ART

In a known technology for producing semiconductors, a process of ion implanting various types of conductive impurities, such as boron (B), phosphorus (P), and arsenic (As), as a solid gas onto a surface of a semiconductor substrate is extensively used. In a beam line type ion implanter that is used in the ion implanting process, in order to prevent splitting of charges of the device on a wafer or in order to prevent divergence of beam resulting from the space charge effect of the ion beam, a charge neutralizing device that reduces accumulation of the charge by supplying electrons having low energy to beam plasma or a surface of the wafer is frequently used.

FIG. 10 schematically illustrates a mechanical scan type ion implanting device, which is called a high current ion implanter. The ion implanting device 1 is mainly formed of three parts, that is, an ion source chamber 2, a beam line 3, and an end station part 4. The ion source chamber 2 includes an ion source 5 that generates high density plasma using an arc discharge and extraction electrodes 6 that electrostatically extracts ions to accelerate the ions. The beam line 3 includes a magnetic deflection type mass separator 8 that selects desired dopant ions from the ion beam 7 emitted from the ion source chamber 2, and a trimming aperture 9 for shaping the ion beam 7 or a mass resolving slit 10 that is provided on the focus of the analysis magnet to select the desired dopant ions. The end station part 4 includes a Faraday cage 11 and a beam catcher 12 for measuring a beam current, a rotating disk 14 on which a semiconductor substrate 13 is mounted and which scans the substrate so that the ion beam 7 is uniformly applied to the substrate, and an electron gun 15 that acts as the charge neutralizing device.

The implantation of the ions is performed using the above-mentioned ion implanting device through the following procedure. First, high density plasma is generated using the dopant gas or solid vapor required in the ion source 5. Subsequently, desired acceleration energy is provided at the same time the ions are extracted using the extraction electrodes 6. The accelerated ion beam 7 is selected as the desired dopant ion using the mass separator 8, shaped using the trimming aperture 9 or the mass resolving slit 10, and induced to the object. Meanwhile, the substrate 13 is transferred to the rotating disk 14 and then mounted at a predetermined position. Typically, a plurality of substrates 13 is mounted.

Next, the rotating disk 14 that is provided at a start position (A) that rotates a predetermined number of times, as shown in the drawing and, at the same time, translation (B) is performed. This process is called the mechanical scan type. In the process, the ions are implanted on the entire surface of each substrate of the plurality of substrates 13. The translation is repeated several times to improve implantation uniformity.

Generally, before the ions are implanted, a pattern of a gate electrode is formed on the substrate 13. FIG. 11 illustrates an example of the patterned gate electrode. In this drawing, the substrate 23 (13) is, for example, a P-type substrate, a thick field insulating film 20 is formed on the main surface portion of the substrate 13, a thin insulating film 21 acting as a gate insulating film is formed on a portion of an active region between the insulating films 20, and a gate electrode 22 is formed on the thin oxide film 21. In this state, ion implantation is performed to form impurity regions acting as a source and a drain on the substrate 13 that are provided at both sides of the gate electrode 22. In this case, the ion beam 7 may be formed of phosphorus or arsenic in order to form the N-type source and drain.

When the ions are implanted on the insulating film as described above, particularly, in the case of when the ions are implanted using a beam current of 1 mA or more, the possibility of cracks occurring to the gate insulating film 21 may be increased. To prevent the cracking, a charge neutralizing device shown in FIG. 12 is used in the related art. The charge neutralizing device accelerates first electrons emitted from the electron gun 15 using an electric field of 300 V to radiate the first electrons onto the corresponding Faraday cage 11, thus generating second electrons 23. A portion of the second electrons 23 is provided to the substrate 13 to neutralize the positive charge accumulated on the gate electrode 22. Thereby, the cracking of the gate insulating film 21 may be prevented.

As described above, in the known charge neutralizing device, an electron source or a plasma source is provided so that the electron source or the plasma source approaches the beam at the middle point of the beam line and an electronic current emitted therefrom overlaps the beam and plasma.

However, in the above-mentioned technology, even though charge neutralization occurs at a point close to the electron source, the charge neutralization may not occur at the opposite point (the point that is furthest from the electron source), causing charges of the device to split or divergence of the beam.

Additionally, in a beam-scanning type an ion implanter, the coupling efficiency of supplied electronic current and beam plasma is poor, thus it is very difficult to perform high current ion implantation using the known charge neutralizing device.

Further, in the ion implanter, as described above, the positive charges that are accumulated on the gate electrode 22 are neutralized by the second electrons 23 that are generated from the surface of the Faraday cage 11 due to radiation of the first electrons emitted from the electron gun 15. However, a portion of the first electrons approaches the substrate 13 due to reflection. Accordingly, there is a problem in that high-speed electrons having energy of 300 eV charge the substrate 13 such that the substrate has a negative charge. Furthermore, cracking occurs due to the negative charge, and the gate insulating film 22 deteriorates even if the cracking does not occur.

FIGS. 13 and 14 illustrate a charge neutralizing device where a magnetic dipole type plasma generator for providing electrons having energy of 50 eV or less that includes an extraction electrode for extracting electrons from plasma and a deceleration electrode for decelerating the electrons extracted using the extraction electrode is provided on a front surface of a substrate to be treated (Patent Document 1). In this document, since the magnetic dipole type plasma generator is used as an electron source and a cusp magnetic field where a magnetic field is not present in the plasma is formed in the magnetic dipole type plasma generator, it is possible to easily extract high density plasma of several eV having a predetermined electronic temperature by only applying the magnetic field. The electrons having low energy are supplied to a front surface of the semiconductor substrate that is an object to form the electronic clouds. Therefore, the electrons are supplied to only a portion of the semiconductor substrate that is positively charged, thereby performing charge neutralization. Accordingly, it is possible to perform desired charge neutralization even though charge depends on an ion implantation condition or a device condition. Furthermore, it is possible to form uniform electronic clouds having a large area by using the magnetic dipole type plasma generator.

Patent Document 1: JP-B-8-21361

DISCLOSURE OF THE INVENTION

Problem that the Invention is to Solve

In a known ion implanting device having a charge neutralizing device shown in FIG. 12, as described above, high-speed electrons having energy of 300 eV charges a substrate 13 such that the substrate has a negative charge, causing cracks to occur in the insulation due to the negative charge. Even if the cracking does not occur, a gate insulating film 22 may deteriorate. Furthermore, even though charge neutralization occurs at a point close to an electron source, the charge neutralization may not occur at the opposite point (the point that is furthest from the electron source), causing the charges of a device to split or divergence of a beam.

Additionally, in a beam-scanning type ion implanter, coupling efficiency of supplied electronic current and beam plasma is poor, thus it is very difficult to perform high current ion implantation using the known charge neutralizing device.

Meanwhile, when an ion implanting device that has the charge neutralizing device where a magnetic dipole type plasma generator for generating electrons having energy of 50 eV or less is used, shown in FIG. 14, the above problem is avoided. Thus, it is possible to form uniform electron clouds having a large area.

However, an allowable voltage to split charges is reduced corresponding to an increase in the integration of devices, and a space charge effect to a beam is increased corresponding to the reduction in ion implantation energy, thus there is a need to improve performance of a charge neutralizing device. In the charge neutralizing device, it is difficult to assure desirable effects in the case of a cusp device requiring an internal voltage of 1 V or less.

The invention has been made keeping in mind the above disadvantages occurring in the related arts, and an object of the invention is to provide a charge neutralizing device which is capable of being applied to a substrate 13 having a large area and in which electrons having low energy of 5 eV or less, and preferably 2 eV, are supplied so that charge due to ion implantation and damage by the electrons are avoided with respect to a cusp device.

Means for Solving the Problem

A charge neutralizing device of the invention includes a microwave generating unit, a plasma generating unit that generates plasma using a microwave generated from the microwave generating unit, and a contact unit that brings electrons of the plasma generated from the plasma generating unit into contact with a beam plasma region including an ion beam through a plasma tube which surrounds the ion beam.

In the above-mentioned structure, the plasma is generated using the microwave. Accordingly, the high density plasma having low voltage is generated to extract the electrons having low energy therefrom. The neutralizer is very advantageous in that it is possible to obtain a large amount of plasma having low energy in comparison with DC discharge plasma or RF plasma that is typically used.

In the charge neutralizing device of the invention, the contact unit includes a plasma tube surrounding the ion beam in a ring shape. Thus, the electrons may be supplied to the ion beam from all directions around the ion beam, thereby significantly reducing nonuniformity according to the position of the charge neutralization.

In the charge neutralizing device of the invention, the contact unit includes a plasma tube disposed to surround the ion beam or a scan region so that the plasma tube corresponds to a shape of the ion beam or the scan region of the ion beam. Thus, it is possible to significantly reduce nonuniformity according to the position of the charge neutralization even though the shape of the ion beam or the scan region is complex.

In the charge neutralizing device of the invention, a waveguide is disposed to surround an external surface of the plasma tube to introduce the microwave, thereby generating the plasma in the plasma tube. Thus, it is easy to uniformly generate the plasma in the plasma tube.

In the charge neutralizing device of the invention, the plasma generating unit is a coaxial cable.

In the charge neutralizing device of the invention, the waveguide and the plasma tube are adjacent to each other to come into contact with a conductive tube. Therefore, it is possible to generate progressive wave plasma.

In the charge neutralizing device of the invention, the gas is supplied into the plasma tube to generate the plasma. Accordingly, it is possible to efficiently perform radiation of the plasma. The gas for plasma generation is inert gas, such as trace gas. Thus, it is possible to minimize effects on objects, such as semiconductors, to a negligible degree.

In the charge neutralizing device of the invention, a single slit or a plurality of slits is provided between the plasma tube and the waveguide at a predetermined position. Accordingly, the microwave may be transmitted through the slit to generate the high density plasma having low voltage in the tube.

In the charge neutralizing device of the invention, a plurality of slits or openings are formed in a side of the plasma tube that is close to the ion beam. Therefore, since it is easy to uniformly supply the electrons to the beam, uniformity of the charge neutralization may be easily obtained.

In the charge neutralizing device of the invention, the waveguide has a structure where the gas is supplied into the plasma tube so that the gas flows from a downstream to an upstream in the transmission direction of the microwave in the waveguide. Through the above-mentioned structure, a large amount of gas is supplied due to attenuation of the microwave. Accordingly, it is possible to efficiently and uniformly generate the plasma.

In the charge neutralizing device of the invention, the plasma is generated by the excitement of the microwave so as to supply the electrons to the beam plasma including the ion beam.

In the charge neutralizing device of the invention, the plasma is generated by the excitement of the microwave so as to supply the electrons to at least one portion of the ion beam and the beam plasma including the ion beam that is in the vicinity of the solid gas. In addition to the beam or the beam plasma, charge of a solid substrate, such as a semiconductor substrate, may be neutralized.

In the charge neutralizing device of the invention, the plasma is maintained at low temperatures by the excitement of the microwave so as to supply a large amount of electrons having low energy. Therefore, the neutralizer may be applied to a process of a micro device using implantation of the electrons having low energy and high beam current.

In the charge neutralizing device of the invention, a stationary wave of the microwave is formed in the waveguide to generate the plasma. Since the stationary wave is generated to efficiently obtain stable plasma, it is possible to efficiently maintain stable charge neutralization.

An ion implanting device on which the charge neutralizing device of the invention is mounted is advantageous in that it is possible to supply charge having low energy of 5 eV or 2 eV or less while uniformity of charge neutralization is maintained with respect to size increase of a semiconductor wafer.

A beam line device on which the charge neutralizing device of the invention is mounted is advantageous in the same view.

It is possible to produce a semiconductor device having an internal voltage of 1 V or less in high yield using the charge neutralizing device, the ion implanting device, and the beam line device of the invention.

Additionally, the microwave plasma of the invention is generated in an Off ECR mode. In an ECR mode, if the energy of the electrons generated in the plasma is increased, it is difficult to prevent the splitting of charge while using the electrons having low energy. On the other hand, in the off ECR mode, it is possible to suppress the energy of the electron while maintaining high plasma density. Thus, it is possible to ensure optimal condition to neutralize the charge of the wafer.

In the ECR mode, when the microwave is used, the electrons form a magnetic field having the same cyclotron frequency as that of the microwave, thus efficiently increasing energy of the electron. Accordingly, in the invention, it is preferable that the system generating the plasma does not satisfy the ECR condition. In detail, in the case of when the microwave of 2.45 GHz is used, intensity of the magnetic field that provides the same cyclotron frequency to the electrons is 875 Gauss. Therefore, it is preferable that the magnetic field of 875 Gauss not be present in the system.

Hence, in the case of when the magnetic field is used, the intensity of the magnetic field that is provided by a magnet is set to deviate from the ECR point. In practice, with respect to the intensity of the magnetic field when the cusp magnetic field is used, there is no problem because the magnetic field has weak intensity of 500 Gauss or less.

Advantage of the Invention

As described above, it is possible to generate high density plasma having low energy in the invention.

Additionally, a semiconductor device that is produced using a charge neutralizing device, an ion implanting device, and a beam line device according to the invention and has an internal voltage of 1 V or less can have high reliability.

Furthermore, an object, such as an electron device, which is produced by using the charge neutralizing device, the ion implanting device, and the beam line device according to the invention is advantageous in that charge neutralization is efficiently performed and reliability is high. Accordingly, in the case of when long life or high reliability is needed, such as rockets for space development, the device can be used.

DESCRIPTION OF REFERENCE NUMERALS AND SIGNS

Figure 1:
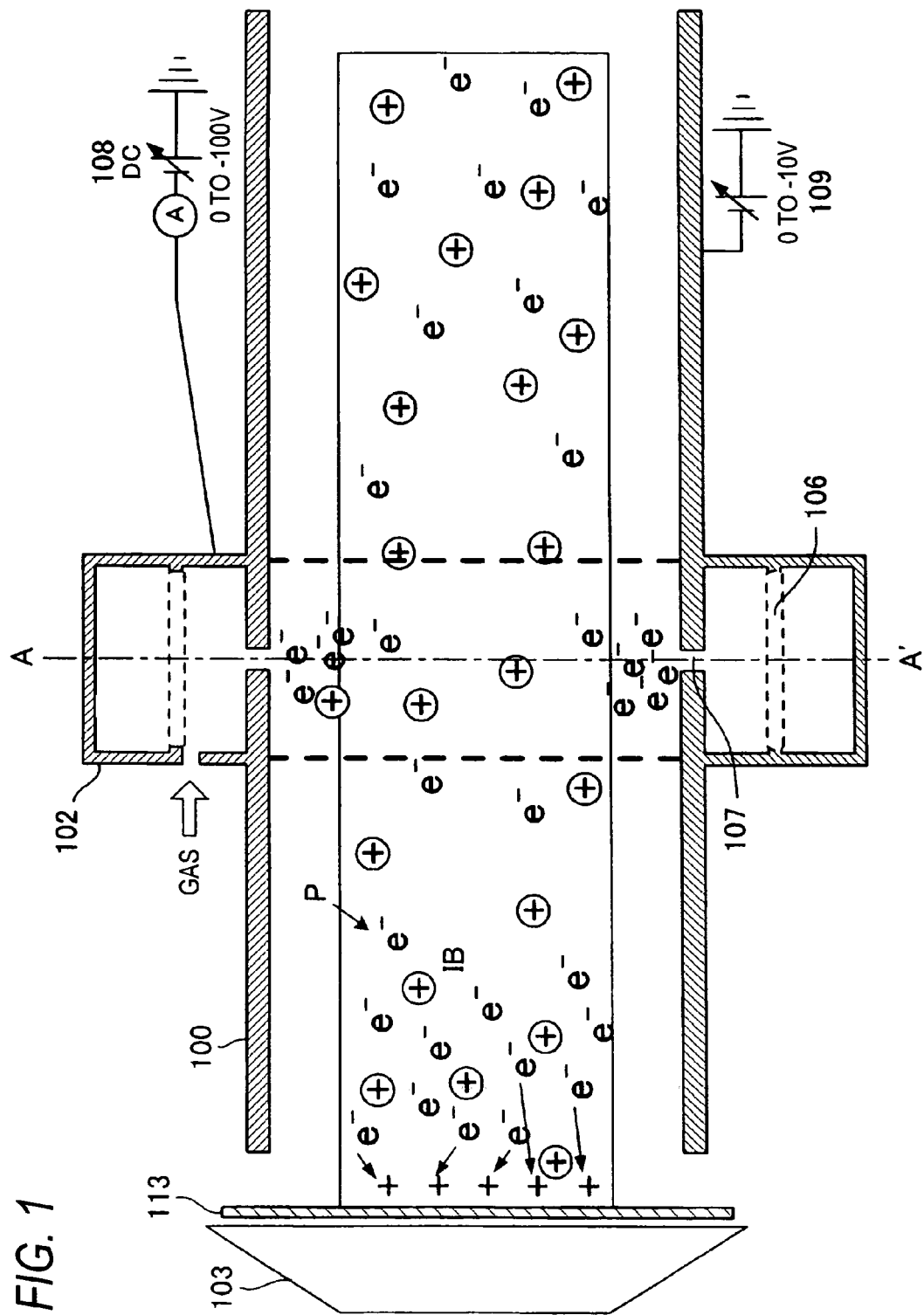
FIG. 1 is a cross-sectional view of a charge neutralizing device according to a first embodiment of the invention that is taken in the direction parallel to an ion beam.

1B: ion beam
P: beam plasma
100: conductive tube
101: plasma tube
102: waveguide
103: wafer support
104: magnetron
106: slit
107: opening
108: second power source
109: first power source
110: cusp magnet
120: cusp magnet
130: cusp magnet
113: silicon wafer
1: ion implanting device
2: ion source chamber
3: beam line
4: end station
5: ion source
6: extraction electrodes
7: ion beam
8: mass separator
9: trimming aperture
10: mass resolving slit
11: Faraday cage
13: substrate 14: rotating disk
15: electron gun
20: field insulating film
21: gate insulating film
22: gate electrode
23: second electron
31: electron source
40: arc chamber
41: cathode
42: permanent magnet
43: gas bottle
44: gas inlet
45: extraction electrode
46: deceleration electrode
47: vacuum pump

BEST MODE FOR CARRYING OUT THE INVENTION

Hereinafter, embodiments of the invention will be described.

First Embodiment

Figure 2:
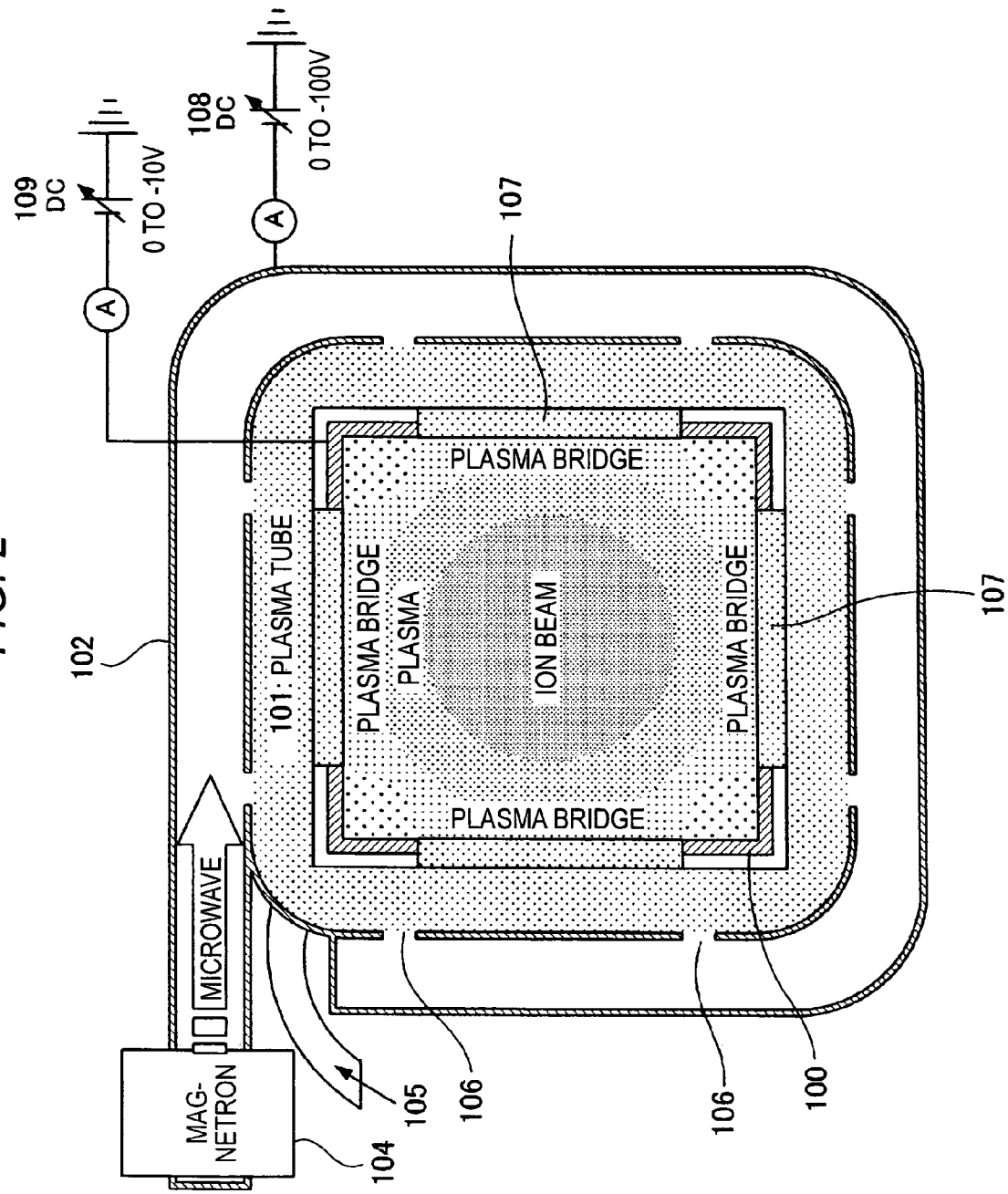
FIG. 2 is a cross-sectional view of the charge neutralizing device according to the first embodiment of the invention that is taken in the direction perpendicular to the ion beam.

As shown in a cross-sectional view of FIG. 1 and a cross-sectional view of FIG. 2 that is taken along the line A-A' of FIG. 1, a charge neutralizing device of this embodiment radiates a beam plasma P that includes an ion beam IB supplied from a plasma generator (not shown) onto a silicon wafer 113 that is a substrate to be treated on a wafer support 103, and prevents charge of the silicon wafer.

The charge neutralizing device is provided with a plasma tube 101 and a waveguide 102. The plasma tube 101 is disposed at a predetermined position of a conductive tube 100 that is a path through which the ion beam IB passes so as to surround a circumference of a side of the conductive tube perpendicular to the axis of the conductive tube. The waveguide 102 is disposed so as to surround an external surface of the plasma tube 101. Electron plasma is generated in the plasma tube 101 to compensate for lack of electrons of the beam plasma P surrounding the ion beam IB, thereby preventing the charge.

In the neutralizer, a microwave is applied from a magnetron 104 as a microwave generating unit through the waveguide 102 to the plasma tube 101 and, at the same time, gas is supplied into the plasma tube 101 to generate electron plasma in the plasma tube 101. If the lack of electrons occurs in a system including the ion beam IB and the charge is generated so as to form a positive charge, electrons (plasma) are supplied through the openings 107 formed in an internal wall of the plasma tube 101 to neutralize the charge of the ion beam IB.

In connection with this, the microwave that is transmitted through the waveguide 102 from the magnetron 104 is transferred through slits 106 formed on the interface of the waveguide 102 and the plasma tube 101 into the plasma tube 101. The gas that is supplied through a gas inlet 105 formed at a downstream of the plasma current of the plasma tube 101 is ionized to generate the electron plasma.

The electrons in the plasma tube 101 are supplied through the openings 107 formed through the conductive tube to the beam plasma P.

An electric potential Vc of a surface of the conductive tube 100 varies in the range of 0 to 10 V by a first power source 109.

An electric potential Vg of a surface of the waveguide 102 varies in the range of 0 to 100 V by a second power source 108.

If not enough electrons are generated in the ion beam system P, the electrons are instantly supplied from the plasma tube 101 to compensate for the lack of electrons.

The amount of supplied electrons may be controlled by adjusting Vc and Vg.

As described above, the electrons are supplied through the openings 107 to the beam plasma immediately after the amount of electrons is slightly reduced in the beam plasma.

Next, an ion implantation process will be described. In the ion implantation process, ions are implanted onto a surface of a silicon wafer on which a gate oxide film is formed using a gate electrode as a mask by means of the charge neutralizing device.

First, the silicon wafer on which the gate oxide film and the gate electrode are formed and which is a substrate 113 to be treated is mounted on a substrate support 103.

The beam plasma P including the ion beam is radiated on the silicon wafer. In connection with this, the charge of the beam plasma is in an almost neutralized state between positive ions and negative electrons in the case of a stable steady state where wafer charging does not occur (Plasma neutrality).

However, when a device where an insulating film, such as FET, is provided on the silicon wafer is formed to have an insulating film, such as the gate oxide film, on a surface thereof, charging occurs due to the charge transferred by the ion beam.

As described above, the device breaks if the charging on the wafer exceeds an internal voltage limit of the insulating film. To prevent this, it is necessary to neutralize the positive charge on the wafer using the negative electronic charge.

In connection with this, if energy of the electron is high, electrostatic splitting occurs in the device due to the negative charging by the electron. Accordingly, the energy of the electron must be lower than the internal voltage limit of the device.

For example, when a gate insulating film has a thickness of 1 nm, an internal voltage limit is about 1 V or less.

If the positive charging occurs on the silicon wafer due to the beam, the low energy plasma electrons that are present in the beam plasma in the vicinity of the charging point are transferred to an electrostatically charged portion on the wafer so as to neutralize the charge.

Thereby, the neutralized state of the charge of the beam plasma is dissipated, in which the charge leans to be the positive.

If the progress of the above-mentioned state continues, since the beam plasma is broken, an electric potential of the beam is significantly increased and the splitting of charges on the wafer occurs. Accordingly, the beam diverges due to the positive charge thereof, thus it is impossible to implant the ions.

In order to avoid this, the electrons having low energy are supplied from the plasma tube to the beam plasma system at the same time the positive charging occurs, thereby preventing the charging of the wafer while the neutralization of the beam plasma is maintained. Accordingly, a stable ion implantation process with a device having high yield is assured.

The total electron current applied onto the wafer may be controlled by a device condition or a process condition. With respect to this, a few control parameters may be used.

One of the control parameters is a negative voltage applied to the conductive tube. The electron current supplied to the wafer is increased as the voltage leans to the negative.

Another control parameter is the plasma tube or a negative voltage supplied through the plasma tube to a conductor. The electron current supplied to the wafer is increased as the voltage leans to the negative.

Another control parameter is the intensity of the microwave transmitted through the waveguide. Plasma density in the plasma tube is increased due to the increased intensity, thereby increasing the absolute amount of electrons.

According to the invention, the electrons are extracted from the beam plasma to the substrate to be treated (wafer) 113, causing the lack of electrons. In this state, the electrons having low energy are supplied from the plasma tube to the beam plasma system to maintain the neutralization of the beam plasma while the charging of the wafer is prevented. Accordingly, the stable ion implantation process by the device having high yield is assured.

Second Embodiment

Figure 4:
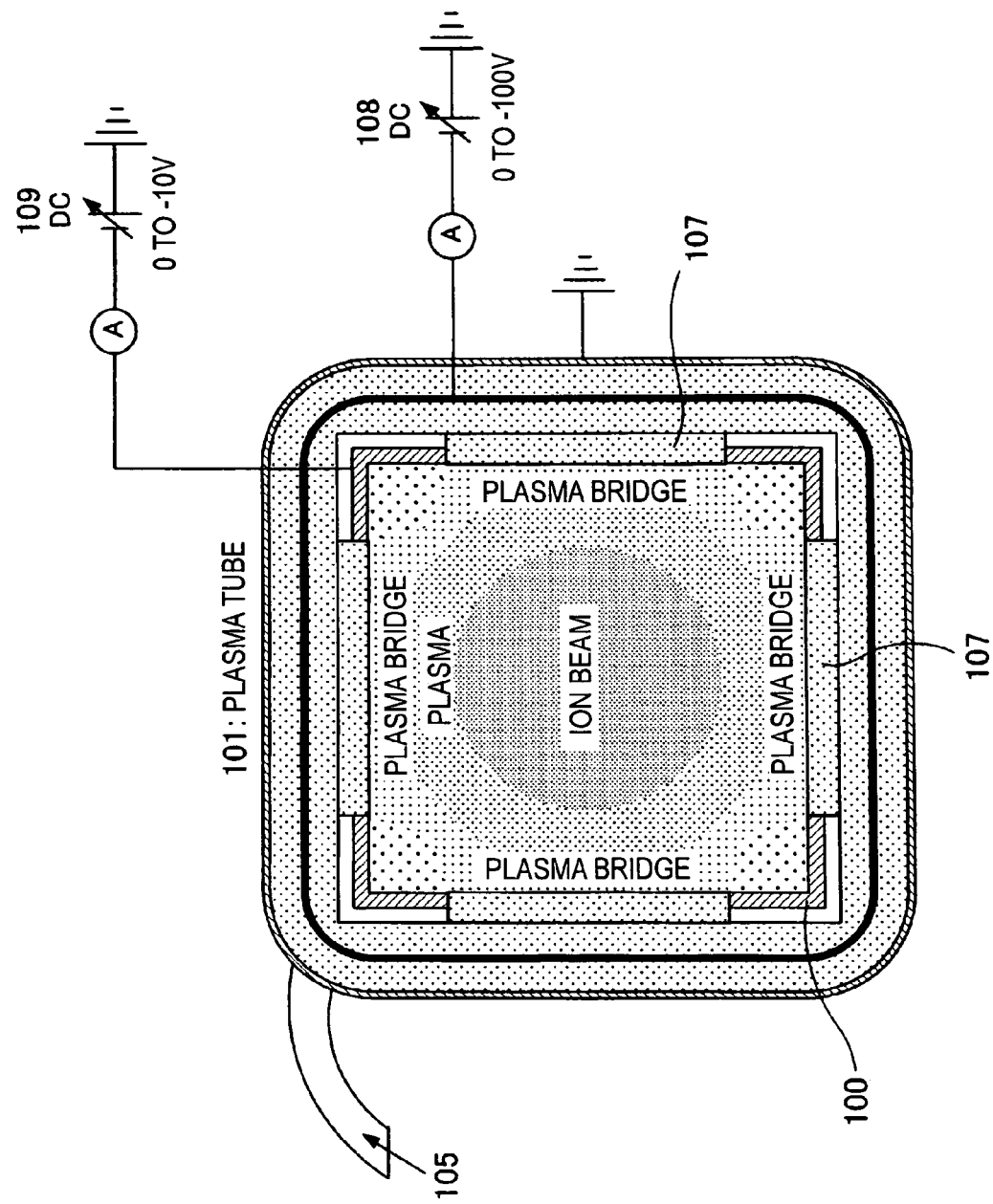
FIG. 4 is a cross-sectional view of the charge neutralizing device according to the second embodiment of the invention that is taken in the direction perpendicular to the ion beam.
Figure 5:
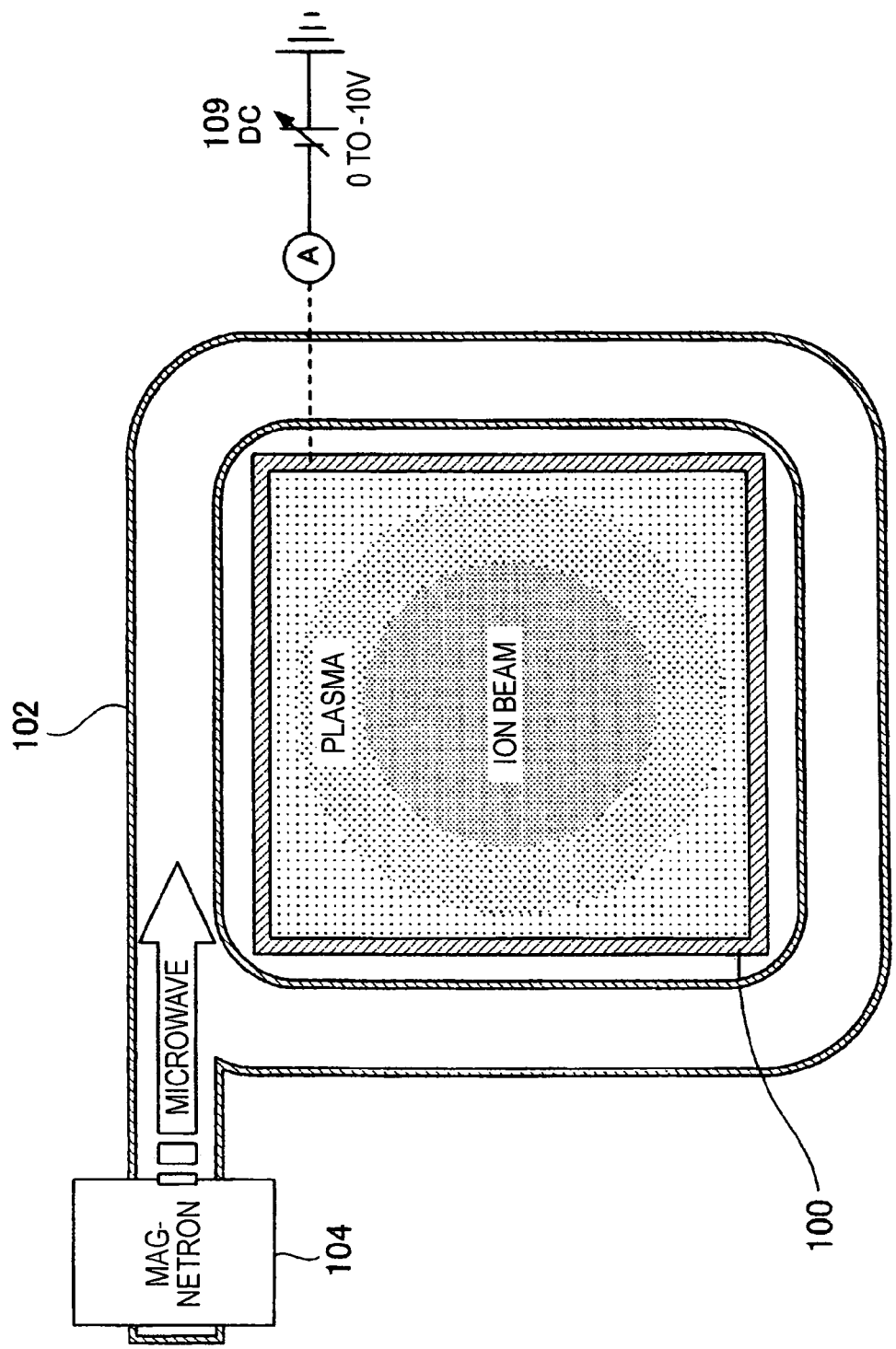
FIG. 5 is a cross-sectional view of the charge neutralizing device according to the second embodiment of the invention that is taken in the direction perpendicular to the ion beam.

In the above-mentioned first embodiment, the plasma tube 101 and the waveguide 102 are provided. The plasma tube 101 is disposed so as to surround the circumference of the side of the conductive tube perpendicular to the axis of the conductive tube. The waveguide 102 is disposed so as to surround the external surface of the plasma tube 101, and electron plasma is generated in the plasma tube 101. A charge neutralizing device according to this embodiment is shown in the cross-sectional view of FIG. 3 and the cross-sectional views of FIGS. 4 and 5 that are taken along the lines A-A and B-B of FIG. 3. This embodiment is different from the first embodiment in that the plasma tube 101 and the waveguide 102 are adjacent to each other to surround the conductive tube 100. In this embodiment, plasma excitement is performed using a progressive wave.

Additionally, the electric potential for controlling bias is supplied from a second power source 108 through a bias wire 110 disposed in the plasma tube 101. The rest of the constitution parts are the same as the first embodiment.

Figure 8:
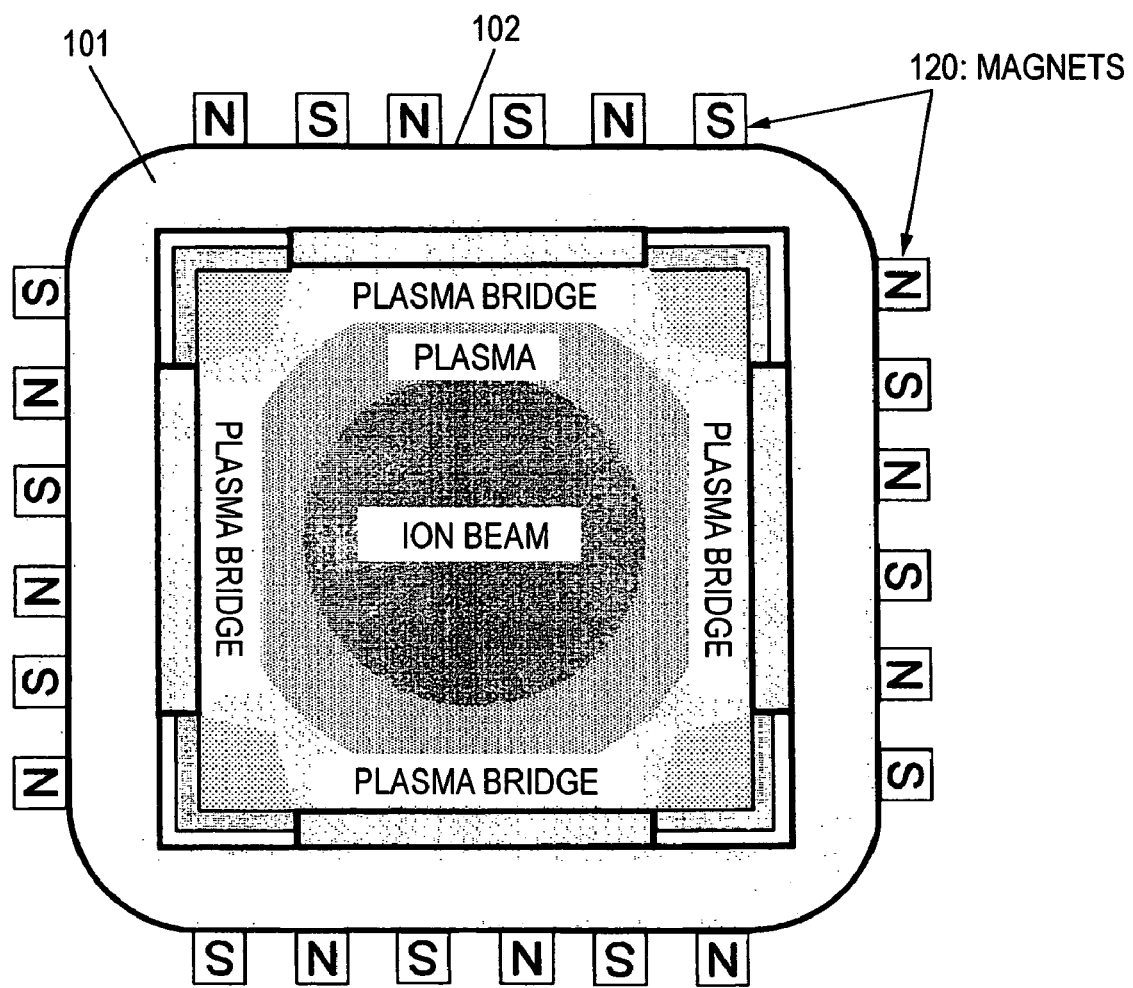
FIG. 8 is a cross-sectional view of a charge neutralizing device according to a fifth embodiment of the invention that is taken in the direction perpendicular to the ion beam.

In this embodiment, when ions are implanted onto the silicon wafer shown in FIG. 8 to form a source and a drain, since the charge is suppressed, the ion implantation is efficiently performed. Accordingly, when the FET has a thin gate insulating film of 1 nm, cracking is suppressed. Therefore, it is possible to obtain FET at high yield without cracking with respect to FET having an internal voltage of 2 eV or less.

The charge neutralizing device is provided with a plasma tube 101 and a waveguide 102. The plasma tube 101 is disposed at a predetermined position of a conductive tube 100 that is a path through which the ion beam IB passes so as to surround a circumference of a side of the conductive tube perpendicular to the axis of the conductive tube. The waveguide 102 is disposed so as to surround an external surface of the plasma tube 101. Electron plasma is generated in the plasma tube 101 to compensate for the lack of electrons of the beam plasma P surrounding the ion beam IB, thereby preventing the charge.

In the neutralizer, a microwave is applied from a magnetron 104 as a microwave generating unit through the waveguide 102 to the plasma tube 101 and, at the same time, gas is supplied into the plasma tube 101 to generate the electron plasma in the plasma tube 101. If not enough electrons are generated in a system including the ion beam IB and the charge is achieved so as to form a positive charge, electrons (plasma) are supplied through openings 107 formed in an internal wall of the plasma tube 101 to neutralize the charge of the ion beam IB.

In connection with this, the microwave that is transmitted through the waveguide 102 from the magnetron 104 is transferred through slits 106 formed on the interface of the waveguide 102 and the plasma tube 101 into the plasma tube 101. The gas that is supplied through a gas inlet 105 formed downstream of the plasma current of the plasma tube 101 is ionized to generate the electron plasma.

Third Embodiment

In the second embodiment, plasma excitement using a progressive wave is described. However, the excitement may be performed using a stationary wave.

Figure 6:
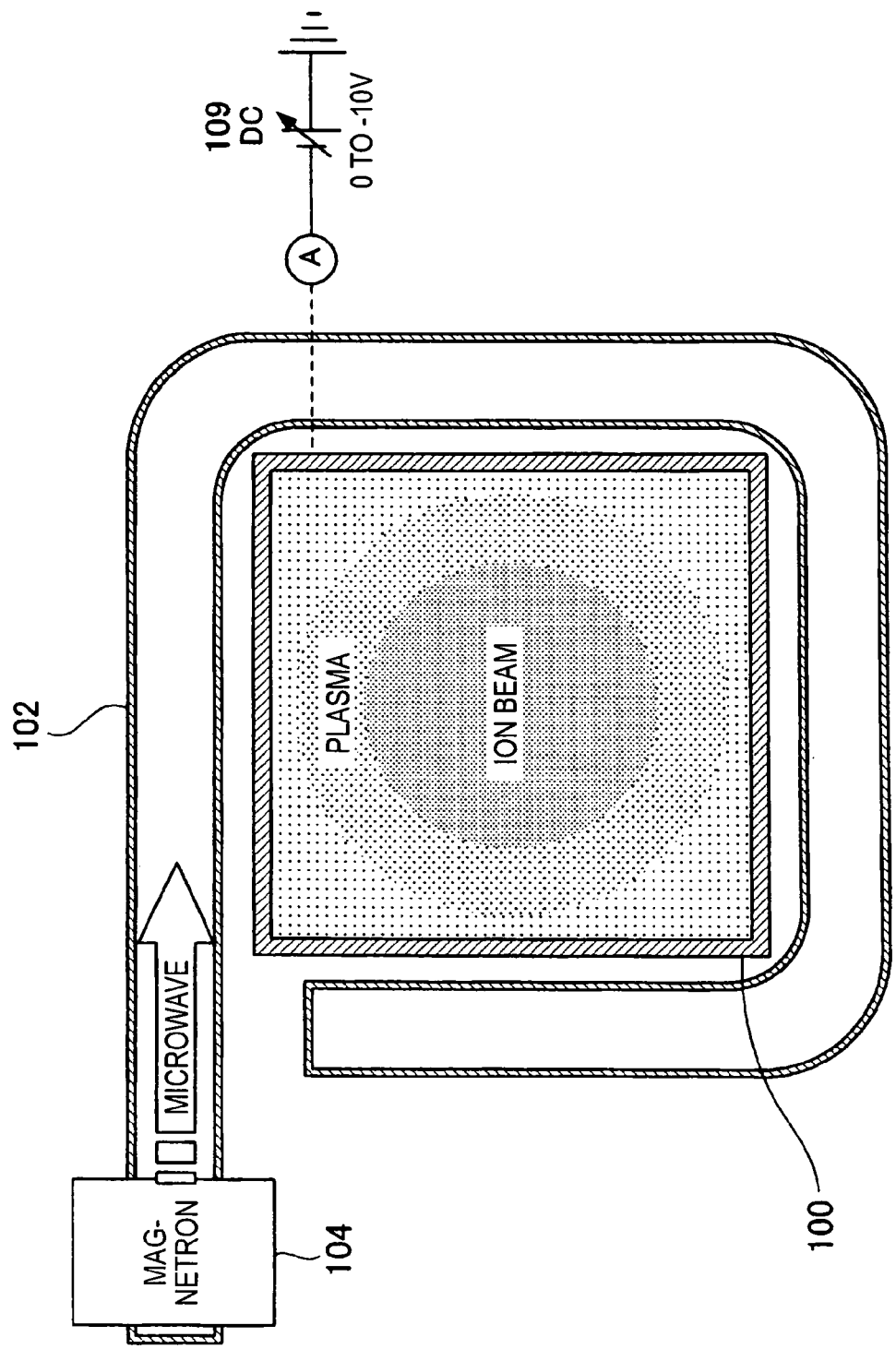
FIG. 6 is a cross-sectional view of a charge neutralizing device according to a third embodiment of the invention that is taken in the direction perpendicular to the ion beam.

The third embodiment is the same as the second embodiment, except that the waveguide 102 has a closed pipe structure to form the stationary wave as shown in the cross-sectional view of FIG. 6 taken in the direction perpendicular to the beam.

Figure 3:
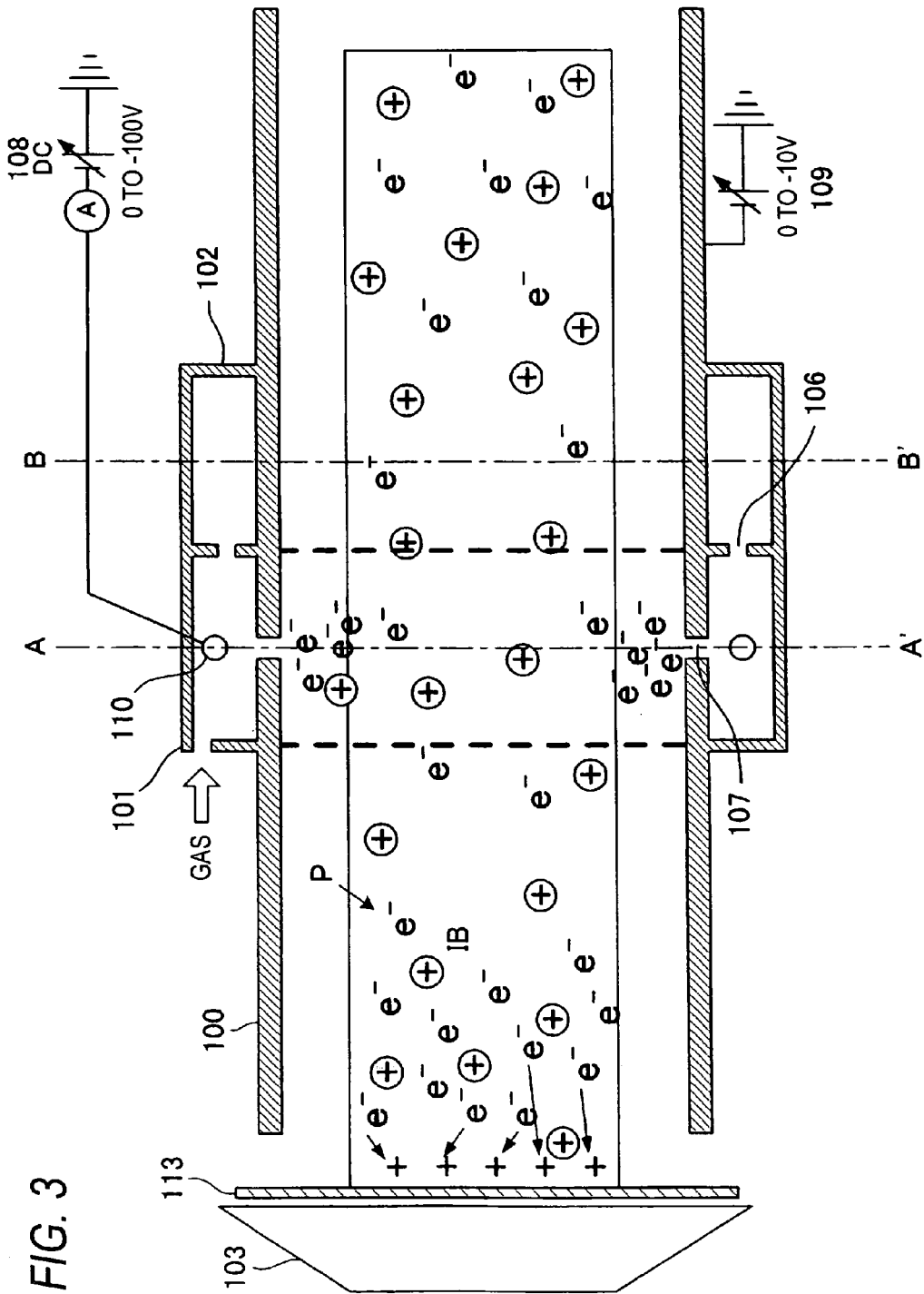
FIG. 3 is a cross-sectional view of a charge neutralizing device according to a second embodiment of the invention that is taken in the direction parallel to the ion beam.

The cross-sectional view that is taken in the direction parallel to the beam is the same as that of FIG. 3.

In this embodiment, the plasma tube 101 and the waveguide 102 are adjacent to each other to surround the conductive tube 100, and plasma excitement is performed using the stationary wave.

Fourth Embodiment

Figure 7:
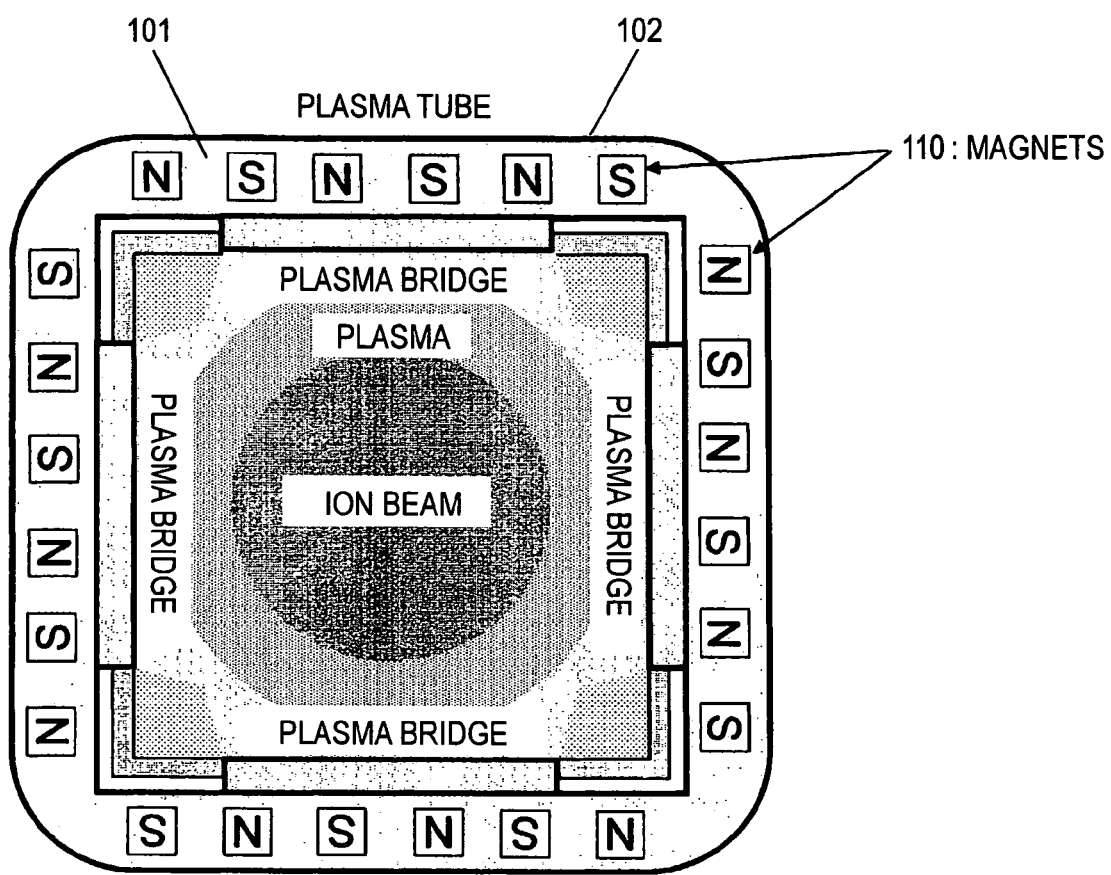
FIG. 7 is a cross-sectional view of a charge neutralizing device according to a fourth embodiment of the invention that is taken in the direction perpendicular to the ion beam.

In this embodiment, as shown in FIG. 7, cusp magnets 110 generating a cusp magnetic field are disposed on a cross-section of the plasma tube 102. The cusp magnets 110 may be disposed on both cross-sections of the plasma tube 102 or any one of the cross-sections of the plasma tube.

The fourth embodiment is the same as the second embodiment, except that the cusp magnets are disposed as shown in the cross-sectional view of FIG. 7 taken in the direction perpendicular to the beam.

The cross-sectional view that is taken in the direction parallel to the beam is the same as that of FIG. 3.

In detail, magnets having magnetic field directions that are opposite to each other are alternately disposed on the cross-sections of the waveguide 102 constituting the plasma tube at predetermined intervals, and a cusp magnetic field is generated in the plasma tube 101. The electrons having low energy are very densely confined in the plasma tube using a magnetic gradient resulting from the cusp magnetic field and a magnetic force caused by the magnetic gradient.

Since the cusp magnetic field is a weak magnetic field having magnetic field intensity of 500 Gauss or less, the intensity automatically deviates from the ECR point, thus there is no problem. However, in the invention, it is necessary to set the magnetic field intensity so that the intensity deviates from the ECR condition in order to increase plasma density and electron energy density.

In this embodiment, the plasma tube 101 and the waveguide 102 are adjacent to each other to surround the conductive tube 100, and plasma excitement is performed using the stationary wave.

Fifth Embodiment

In the fourth embodiment, the cusp magnets 120 are disposed on the cross-sections of the plasma tube 102. However, in this embodiment, the cusp magnets 120 are disposed on a circumferential surface of the plasma tube 102.

That is, in this embodiment, as shown in FIG. 8, the cusp magnets 120 generating the cusp magnetic field are disposed on the circumferential surface of the plasma tube 102.

The fifth embodiment is the same as the second embodiment, except that the cusp magnets are disposed as shown in the cross-sectional view of FIG. 8 taken in the direction perpendicular to the beam.

The cross-sectional view that is taken in the direction parallel to the beam is the same as that of FIG. 3.

In detail, magnets having magnetic field directions that are opposite to each other are alternately disposed on the circumferential surface of the waveguide 102 constituting the plasma tube at predetermined intervals, and a cusp magnetic field is generated in the plasma tube 101. The electrons having low energy are very densely confined in the plasma tube using a magnetic gradient resulting from the cusp magnetic field and a magnetic force caused by the magnetic gradient.

Sixth Embodiment

In the above-mentioned embodiments 4 and 5, the cusp magnets 110 or 120 are disposed on the cross-sections or the circumferential surface of the plasma tube 102. However, in this embodiment, the cusp magnets 130 are disposed on inside and outside of the plasma tube 102 so that the plasma tube is interposed between the magnets.

Figure 9:
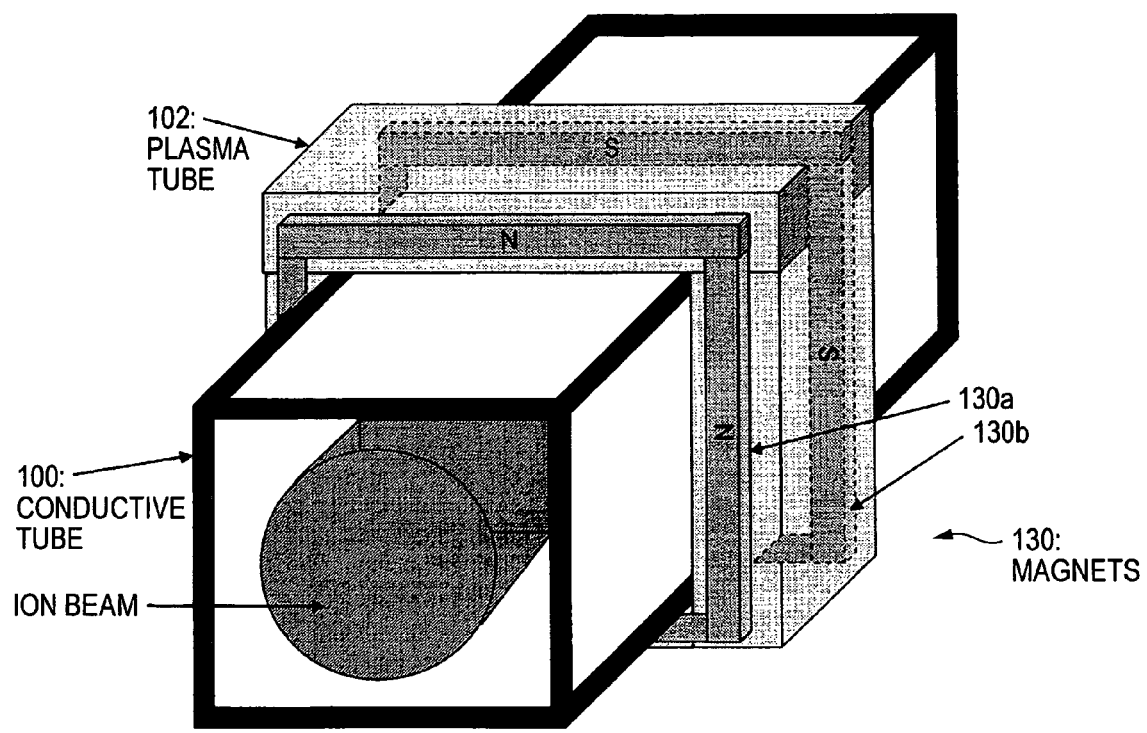
FIG. 9 is a perspective view of a charge neutralizing device according to a sixth embodiment of the invention.
Figure 10:
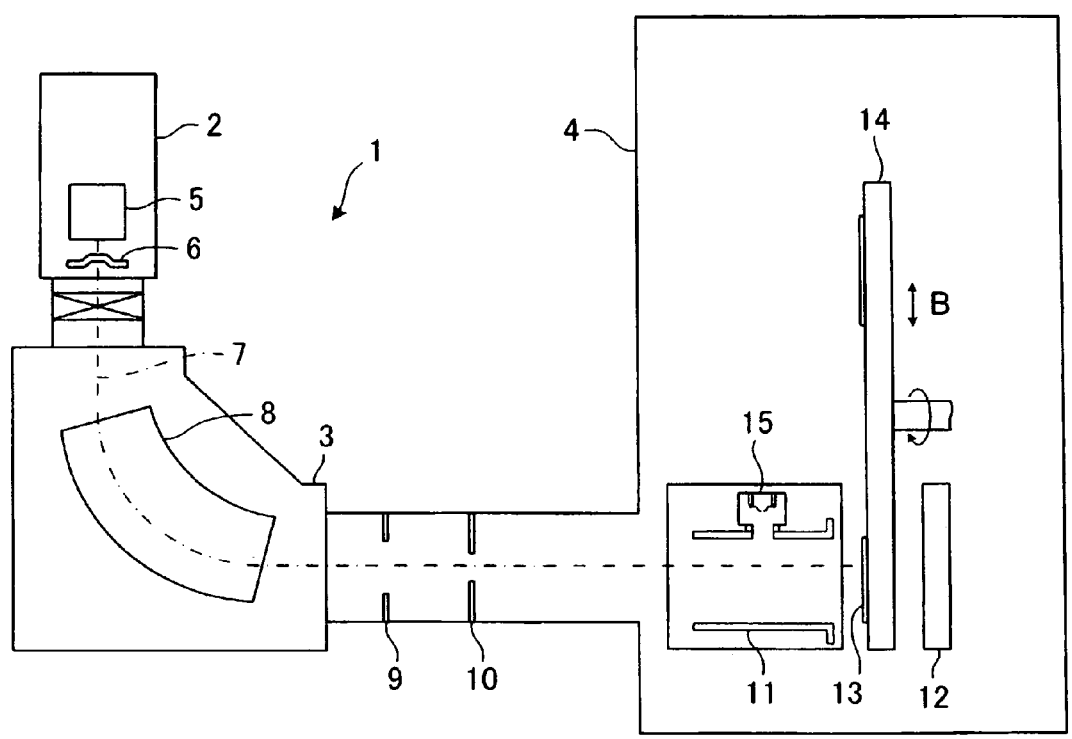
FIG. 10 is a schematic view showing a known ion implanting device.
Figure 11:
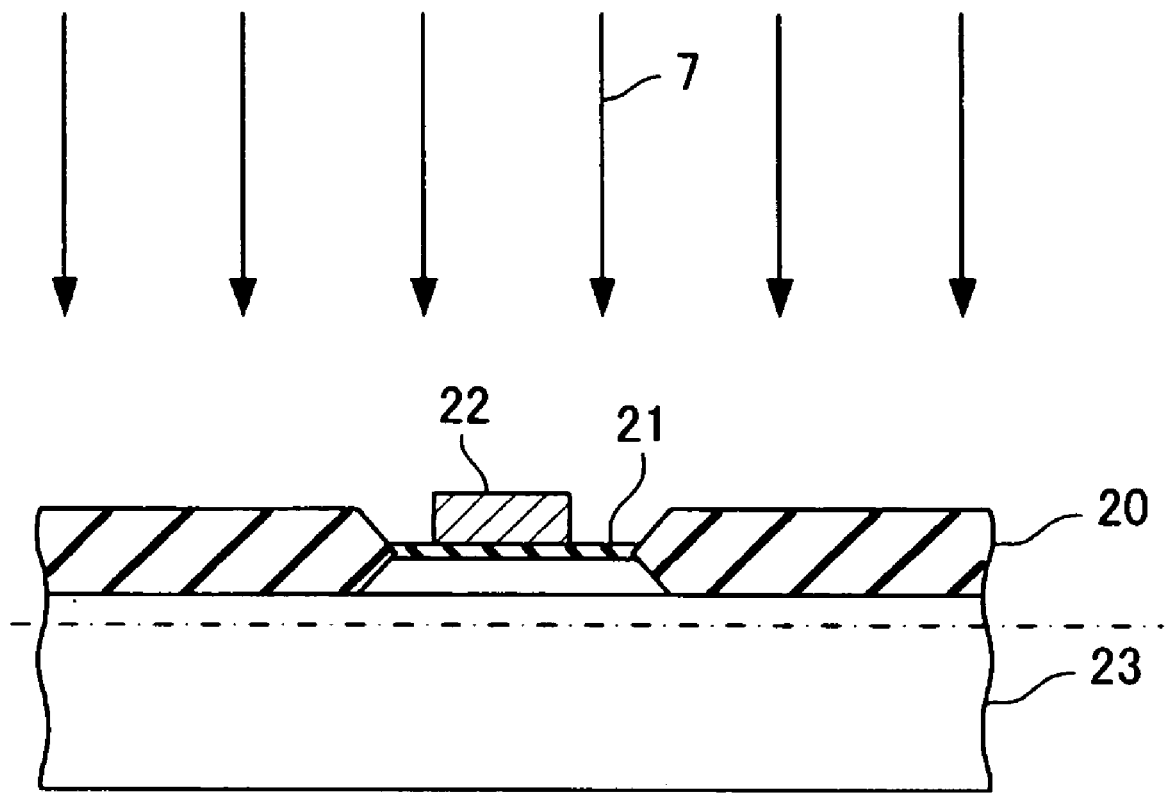
FIG. 11 illustrates ion implantation onto a semiconductor substrate.
Figure 12:
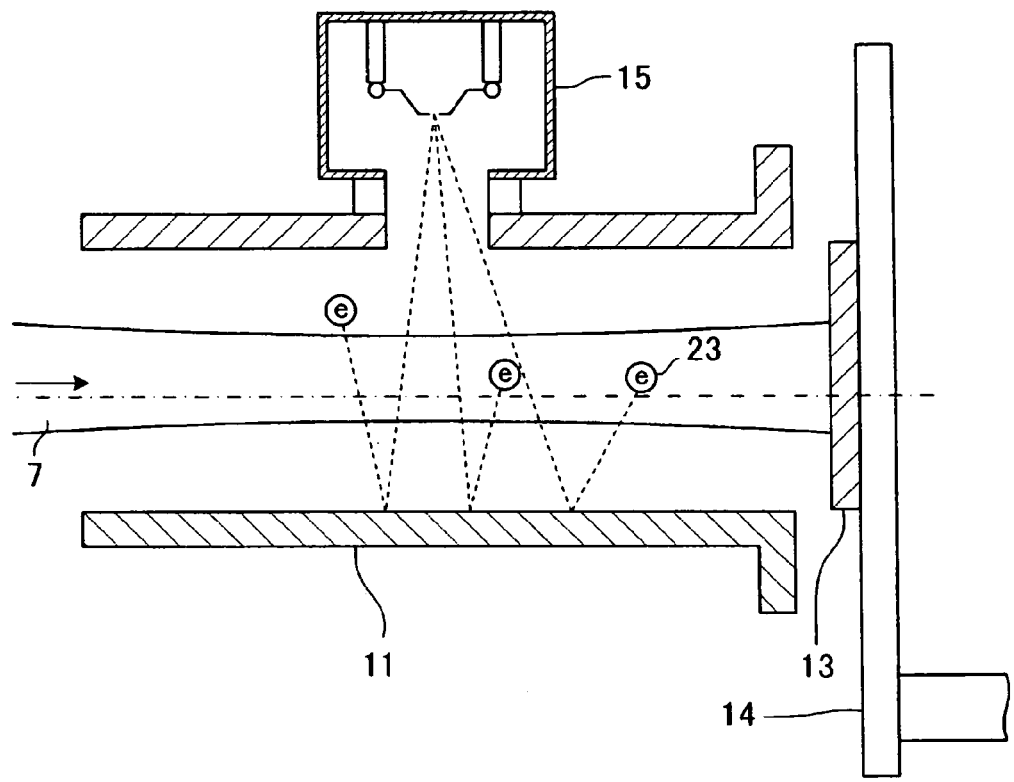
FIG. 12 illustrates a known charge neutralizing device.
Figure 13:
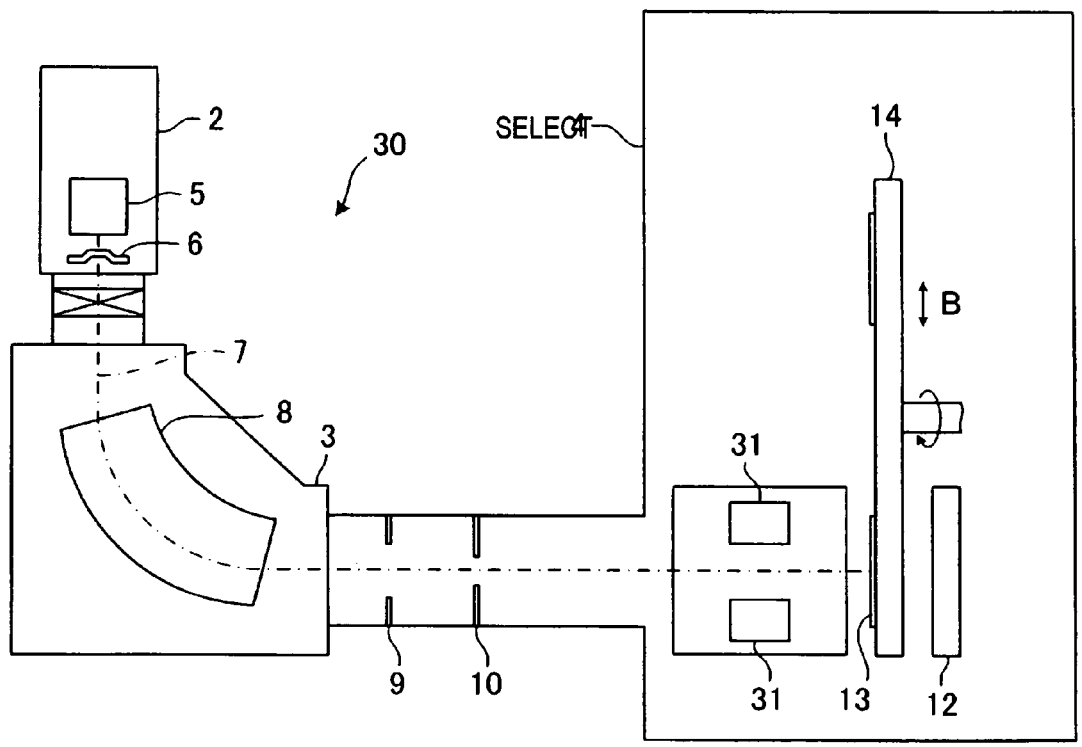
FIG. 13 is a schematic view showing a known ion implanting device.
Figure 14:
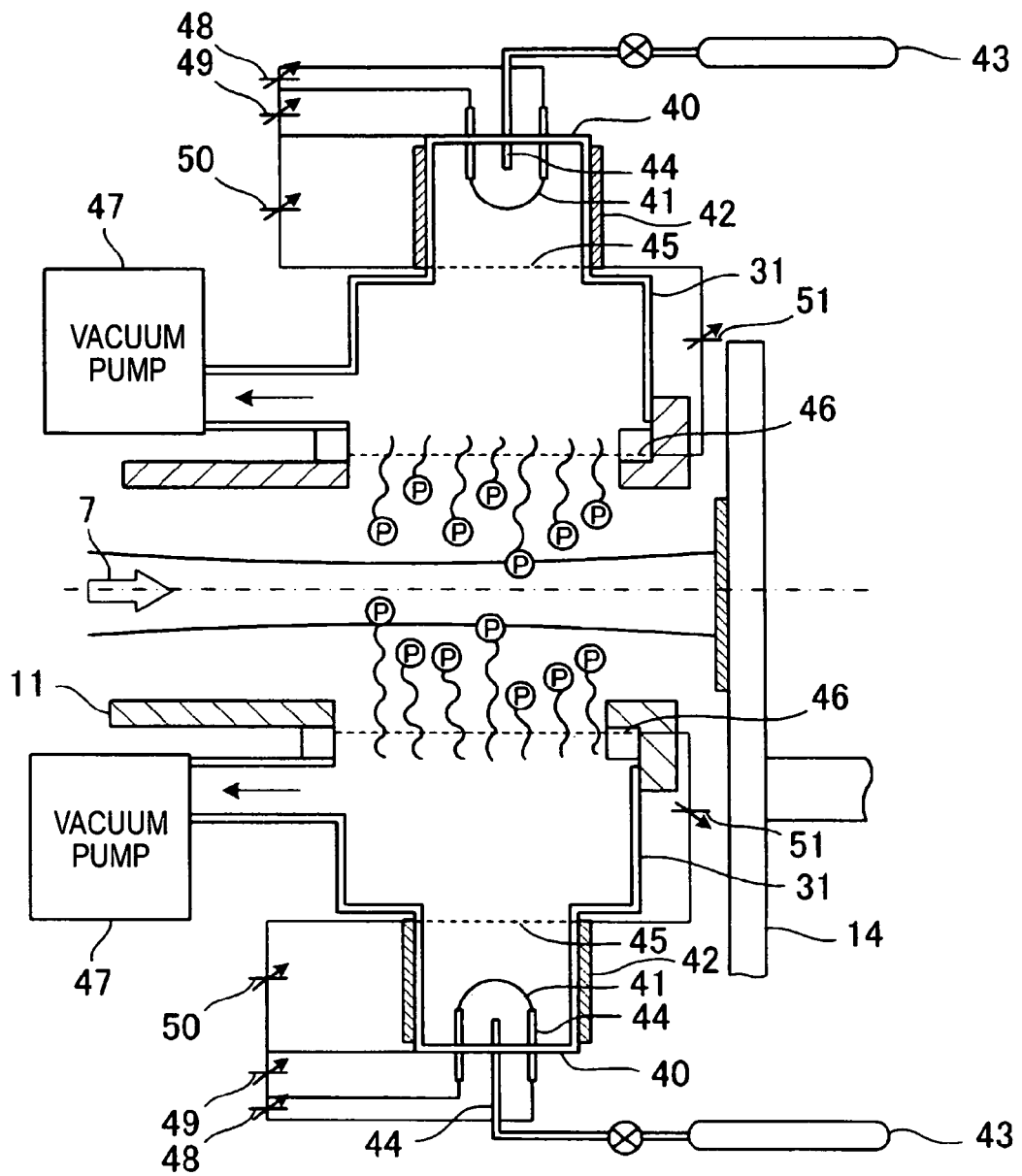
FIG. 14 illustrates a known charge neutralizing device.

That is, in this embodiment, as shown in FIG. 9, the cusp magnets 130 generating the cusp magnetic field are disposed on the inside and outside surfaces of the plasma tube 102.

As shown in the perspective view of FIG. 9, the sixth embodiment is the same as the second embodiment, except that the positions of the cusp magnets of the sixth embodiment are different from those of the second embodiment.

The cross-sectional view that is taken in the direction parallel to the beam is the same as that of FIG. 3.

In detail, magnets having magnetic field directions that are opposite to each other are alternately disposed on the inside and outside surfaces of the waveguide 102 constituting the plasma tube at predetermined intervals, and a cusp magnetic field is generated in the plasma tube 101. The electrons having low energy are very densely confined in the plasma tube using a magnetic gradient resulting from the cusp magnetic field and a magnetic force caused by the magnetic gradient.

In the above-mentioned embodiments one to six, the plasma generator using the waveguide is described. However, it is possible to perform plasma excitation using a coaxial cable instead of the waveguide.

INDUSTRIAL APPLICABILITY

The invention is advantageous in that electrons having low energy are efficiently and uniformly supplied to prevent charge due to ion implantation and damage caused by electrons and to efficiently neutralize a space charge of an ion beam having low energy, and it is possible to provide a charge neutralizing device capable of being applied to a substrate having a large area.

The invention claimed is:

1. A charge neutralizing device, comprising:
   a microwave generating unit;
   a plasma generating unit that generates an electron plasma by using a microwave generated from the microwave generating unit; and
   a contact unit that brings the electron plasma generated from the plasma generating unit into contact with a beam plasma region including an ion beam through a plasma tube which surrounds the ion beam.

2. The charge neutralizing device according to claim 1, wherein the plasma tube surrounds the ion beam in a ring shape.

3. The charge neutralizing device according to claim 1, wherein the contact unit includes a plasma tube which is disposed so as to surround the ion beam or a scan region so that the plasma tube corresponds to a shape of the ion beam or the scan region of the ion beam.

4. The charge neutralizing device according to claim 2, wherein the plasma generating unit includes a waveguide disposed so as to surround an external surface of the plasma tube, and the microwave is transferred from the microwave generating unit through the waveguide to the plasma tube while gas is supplied into the plasma tube, thereby generating the plasma in the plasma tube.

5. The charge neutralizing device according to claim 1, wherein the plasma generating unit includes a coaxial cable.

6. The charge neutralizing device according to claim 2, wherein the waveguide is arranged in parallel with the plasma tube to come into contact with a conductive tube which is a path through which the ion beam passes.

7. The charge neutralizing device according to claim 4, wherein the gas is an inert gas.

8. The charge neutralizing device according to claim 4, wherein at least one slit is provided between the plasma tube and the waveguide at a predetermined position.

9. The charge neutralizing device according to claim 8, wherein a plurality of slits are provided between the plasma tube and the waveguide at predetermined positions.

10. The charge neutralizing device according to claim 2, wherein an opening is formed in a side of the plasma tube that is close to the ion beam.

11. The charge neutralizing device according to claim 2, wherein a plurality of openings are formed in the side of the plasma tube that is close to the ion beam.

12. The charge neutralizing device according to claim 2, wherein the waveguide is disposed so as to surround the ion beam at a side thereof at which a transmission direction of the microwave in the waveguide is perpendicular to a flow direction of the ion beam.

13. The charge neutralizing device according to claim 12, wherein the waveguide has a structure where the gas is supplied into the plasma tube so that the gas flows from a downstream to an upstream in the transmission direction of the microwave in the waveguide.

14. The charge neutralizing device according to claim 1, wherein the plasma is generated by the excitement of the microwave so as to supply the electrons to the beam plasma including the ion beam.

15. The charge neutralizing device according to claim 1, wherein the plasma is generated by the excitement of the microwave so as to supply the electrons to at least one portion among portions in the vicinity of the solid base to which the ion beam is radiated.

16. The charge neutralizing device according to claim 1, wherein the plasma is maintained at low temperatures by the excitement of the microwave so as to supply the electrons having low energy of 2 eV or less.

17. The charge neutralizing device according to claim 4, wherein the microwave generating unit is structured so that a stationary wave of the microwave is generated in the waveguide.

18. The charge neutralizing device according to claim 6, wherein the microwave generating unit is structured so that a progressive wave of the microwave is generated in the waveguide.

19. An ion implanting device comprising the charge neutralizing device according to claim 1.

20. A beam line device comprising the charge neutralizing device according to claim 1.

21. A semiconductor device that has an internal voltage of 1 V or less and is formed by performing ion implantation using the charge neutralizing device according to claim 1.

22. An object having an ion implantation region, that is formed by performing ion implantation using the charge neutralizing device according to claim 1.

* * * * *